United States Patent [19]

de Brebisson et al.

[11] Patent Number: 4,608,588
[45] Date of Patent: Aug. 26, 1986

[54] SEMICONDUCTOR DEVICE MANUFACTURED BY USING A MULTILAYER MASK

[75] Inventors: Michel X. M. de Brebisson; Marc Tessier, both of Caen, France

[73] Assignee: U.S. Philips Corporation, Tarrytown, N.Y.

[21] Appl. No.: 768,190

[22] Filed: Aug. 23, 1985

Related U.S. Application Data

[60] Continuation of Ser. No. 361,957, Mar. 25, 1982, abandoned, which is a division of Ser. No. 139,932, Apr. 14, 1980, Pat. No. 4,368,573.

[30] Foreign Application Priority Data

Apr. 20, 1979 [FR] France .................. 79 10086

[51] Int. Cl.[4] .................................... H01L 29/72
[52] U.S. Cl. ................................. 357/34; 357/20; 357/49; 357/56
[58] Field of Search ................... 357/34, 20, 56, 49

[56] References Cited

U.S. PATENT DOCUMENTS 3,717,507  2/1973  Abe ........................ 357/34
4,045,249  8/1977  Hotta ...................... 357/34
4,267,557  5/1981  Muramoto ............. 357/20
4,392,149  7/1983  Horng ..................... 357/50

Primary Examiner—Martin H. Edlow
Attorney, Agent, or Firm—R. J. Meetin; T. A. Briody; R. T. Mayer

[57] ABSTRACT

A semiconductor device contains first and second semiconductive regions (43 and 78) and first, second, and third semiconductive zones (59/61, 79, and 71) of opposite conductivity type to the regions. The first zone adjoins an insulating layer (45/46/47/48/63) along an upper surface of the first region. The second region extends to the upper surface through a window in the insulating layer. The second zone adjoins the second region below the window and is spaced apart from the third zone which extends to the upper surface. The zones and insulating layer upwardly and laterally enclose the second region. A first segment (59) of the first zone is continuous with the third zone and at least partly adjoins the lateral edge of the insulating layer located apart from the window. A second segment (61) of the first zone extends between the first segment and second zone, at least partly adjoins the lateral edge of the insulating layer located along the window, and has a much greater sheet resistance than the first segment.

7 Claims, 36 Drawing Figures

SEMICONDUCTOR DEVICE MANUFACTURED BY USING A MULTILAYER MASK

CROSS REFERENCE TO RELATED APPLICATIONS

This is a continuation of U.S patent application Ser. No. 361,957, filed 25 Mar. 1982, now abandoned, which is a division of U.S. patent application Ser. No. 139,932, filed 14 Apr. 1980, now U.S. Pat. No. 4,368,573.

BACKGROUND OF THE INVENTION

1. Field of the Invention

Method of manufacturing integrated circuits by means of a multilayer mask and device obtained by means of the said method.

The invention relates to a method of manufacturing a semiconductor device having a semiconductor body which is provided at a surface with a transistor having an emitter region and a collector region of the first conductivity type and an intermediately located base region of the second conductivity type, in which a mask having at least two sublayers, a first or bottom layer and a second layer formed on it and which can be etched selectively with respect to each other, is provided on the surface, which mask comprises a first mask portion which covers the region of the emitter and a region of an extrinsic portion of the base at the circumference of the emitter and which is bounded by an aperture in which via said aperture a zone of the second conductivity type is formed in the semiconductor body and the bottom layer is subjected to a selective etching treatment in which by lateral etching an edge of the bottom layer of the first mask portion is removed, after which, via the thus exposed part of the surface, an impurity of the second type is again introduced into the semiconductor body to form the extrinsic portion of the base, and in which at the areas where the second layer and the bottom layer have been removed, an insulating layer is formed of a material with respect to which the layers of the first mask portion can be etched selectively, in which the first mask portion can then be removed entirely and the emitter and the intrinsic portion of the base are then formed via the thus obtained aperture.

2. Description of the Prior Art

It is known that the properties of semiconductor devices are dependent on the shape and the dimensions of the various elements formed in the semiconductor material. In order to improve the behaviour of said devices at very high frequencies, it is endeavoured to reduce the dimensions and to increase the accuracy in the localisations of the regions.

A metehod of the above-mentioned kind is known inter alia from U.S. Pat. No. 3,940,288. In this known method a mask is used having three layers which are situated one on top of the other and which consist alternately of silicon oxide and silicon nitride. In this manner it is possible to obtain, in addition to an emitter of very small dimensions, a base of a low base resistance $r_{bb}$. However, it is not possible by means of the same method to obtain a simultaneous self-alignment of the base contact aperture, the emitter contact aperture and the collector contact aperture and, possible, of the insulation zones so that it would be possible to provide said apertures at a minimum distance from each other without taking into account the alignment tolerances of successive masks.

SUMMARY OF THE INVENTION

It is a particular object of the present invention to mitigate these disadvantages and to provide a method in which contact apertures of emitter, base and collector can be obtained in a self-aligning manner and simultaneously contact apertures and diffusion windows or implantation windows of minimum width can be manufactured with minimum distances between said apertures and said windows.

The invention uses a multilayer mask in which the regions to be provided successively are fully defined. During this method, parts of the mask are protected or removed by means of covering layers for which the positioning can stand some tolerance without objection. The invention furthermore uses the selective undercutting of one of the layers of the mask to obtain apertures of very small dimensions. A method of the kind mentioned in the opening paragraph is characterized according to the invention in that a mask is used which is provided with a second mask portion which is separated from the first mask portion by the aperture in the mask and that the bottom layer of the second mask portion is also subjected to a selective etching treatment in which, by lateral etching, the edge of the bottom layer in said second mask portion is removed in at least two places, so that two windows are obtained of which one, situated on the side of the said aperture in the mask is destined to form the base contact and the other one, situated on the oppositely located side of the second mask portion, is destined to form a collector contact, and that, via the first window, a contact zone of the second conductivity type is provided in the semiconductor body and is connected to the zone provided via the said aperture.

The contact apertures and the boundaries of the various regions formed according to the method of the invention are all determined by the mask which is formed in the beginning of the process.

The windows formed on either side of the said second mask portion by selective removal of the two edges of the lower layer have a width which is substantially equal to the depth of the undercutting of the bottom layer so that said windows which are to serve as contact apertures can be given a minimum dimension.

The mutual distance between the base contact window and the collector contact window formed on either side of the second mask portion depends on the width of said portion. This mutual distance can be given an optimum value which, if desired, can be very small and is restricted only by insulation conditions between the contacts. In the same manner, the mutual distance between the emitter and the base contact is determined by the mutual distance between the two mask portions in the mask. This mutual distance can have a very small value.

In addition to the advantages of a minimum emitter width and a very small internal base resistance $r_{bb}$, the method according to the invention enables a self-alignment of the zones and windows which are necessary for the emitter, base and collector contacts.

In a preferred embodiment of the invention the mask comprises at least three layers in which an auxiliary layer is provided especially below the bottom layer, which auxiliary layer is chosen to be so as to be selectively etchable with respect to the said insulating mask layer and that as a result of the lateral etching of the bottom layer a strip of the auxiliary layer is exposed, which strip in turn is removed selectively with respect to the insulating mask layer to form the windows which are used for the base and collector contacts. One of the advantages of this preferred embodiment is a wider choice of different materials to form the mask so that it is possible to determine a combination of layers which ensure the selectively of the etching under the simplest operating conditions.

A further preferred embodiment is characterized in that a mask is used of which at least one of its layers can withstand oxidation of the semiconductor body so that the said insulating mask layer can be formed by local oxidation of the free surface of the semiconductor body.

The method according to the invention not only permits a self-alignment of the active regions and zones of the transistors, as well as of the windows for the contacts, but also a self-alignment of deep insulation zones of an integrated circuit, in particular when they are formed by dielectric material. According to a particularly favourable embodiment of the method in accordance with the invention one preferably proceeds as follows to form a deep insulation region at the periphery of the transistor, at least certain limits of the deep region being marked during the first etching of the shape of the mask: first the shape of the first and second mask portions is formed in the second layer, then a doping window is etched in the bottom layer via which window the insulation zone is provided, after which in the bottom layer the aperture is provided in the mask which is situated above the extrinsic portion of the base.

The insulation region thus corresponds accurately with the positions of the active regions of the transistors and the apertures destined for the contacts.

The active regions and contact zones are preferably formed by ion implantation; in that case the covering layers can be manufactured from photosensitive lacquer or from an organic material of the polyimide type; because these coating layers do not determine the dimensions of the regions and the apertures, they do not require a great accuracy of dimension and/or position with respect to the mask itself.

The invention also relates to a semiconductor device which is not only characterized by the fact that it has been obtained by means of the present method, but in addition by its structure in which at least one of the transistors which form this device has a base region which is provided so that from the intrinsic part of the base to the base contact it comprises successively: an extrinsic part having a connection zone and a contact zone.

The device manufactured by means of the method according to the invention shows a structure which is particularly favourable for use at high frequencies: the dimensions are minimum and accurate, and the internal base resistances are very small. Moreover, the distance between the base contact zone and the collector contact zone is obtained with great accuracy.

BRIEF DESCRIPTION OF THE DRAWING

The invention will be described in greater detail, by way of example, with reference to a few embodiments and the accompanying drawing, in which.

Figure 1A:
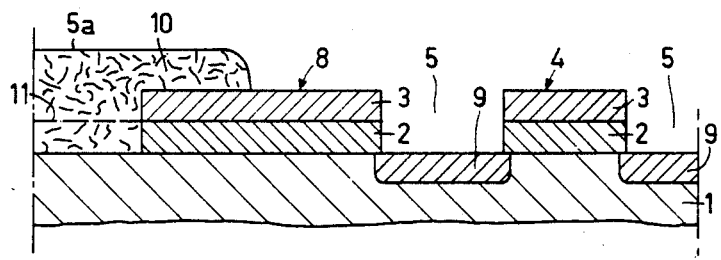
FIGS. 1A to 1H are diagrammatic sectional views of a semiconductor device corresponding to the principal successive phases of the manufacture by the method according to the invention.

It is to be noted that in the drawings, for clarity, the proportions have not been respected in particular as regards the thickness of the various layers.

DESCRIPTION OF THE PREFERRED EMBODIMENT

FIGS. 1A to 1H show in various stages of the manufacture thereof a semiconductor device having at least one transistor with its three successive regions of alternate conductivity types; a very narrow emitter, a base and a collector. According to the invention, the base region comprises several parts: an actual base zone termed the intrinsic portion of the base region and underlying the emitter; and an extrinsic portion comprising a first portion extending from the periphery of the intrinsic base, a base contact zone and a connection zone between the first extrinsic part and the contact zone.

The device is manufactured from a flat semiconductor body, in general silicon, of which at least the surface portion in which the collector is to be formed is of a first conductivity type. This surface portion of the semiconductor body is referenced 1 in FIGS. 1A to 1H.

A mask is formed on the top surface of said semiconductor body 1, which mask consists of several protective layers, including at least a first or bottom layer 2 and a second layer 3 which is provided above the bottom layer 2. These layers are manufactured from several materials which can be etched selectively with respect to each other so that the bottom layer 2 can be etched selectively with respect to the second layer 3, and conversely.

As a bottom layer may be used, for example, a layer 2 of silicon nitride having a thickness of 0.06 to 0.1 $\mu$m, and as second layer may be used a layer 3 of silicon oxide having a thickness of 0.1 to 0.2 $\mu$m.

According to a method known per se, a mask is formed from the layers 2 and 3 by etching. The mask is shown in FIG. 1A and comprises a first mask portion 4, and apertures, for example aperture 5, which adjoins the edge of said portion 4.

According to the invention, the mask also comprises a second mask portion 8 near the first portion 4 and separated therefrom by the aperture 5 or by a least a part of said aperture.

Via the aperture 5 of the mask a doping impurity of the second conductivity type is introduced into the semiconductor 1 so that the part of the base zone forming a connection zone 9 for the base region is obtained.

This impurity is preferably provided at a high concentration, for example by means of ion implantation. A coating layer 10 of photosensitive lacquer or of an organic material of the polyimide type may be used to protect the part 5a of the aperture in the mask where the introduction of impurity is not desired. A diffusion method might also be used to obtain the connection zone 9, in which case the bottom layer 2 would have to be maintained on the part 5a of the aperture in the mask; this is denoted by the broken line 11 in FIG. 1A in which the position of the second mask portion 8 is defined by the second layer 3 of said portion. After the diffusion, the second portion 8 may be provided in the configuration as is shown in solid lines in FIG. 1A, the portion of the second layer 3 being used as a reference for the selective removal of the bottom layer 2.

Figure 1B:
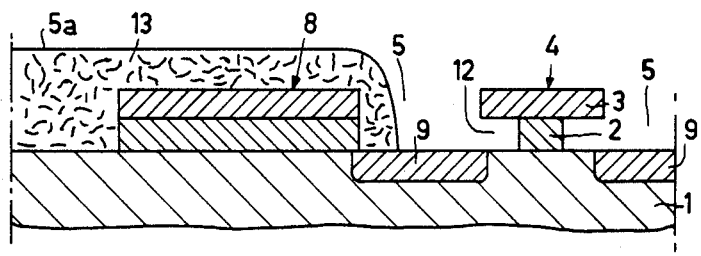
Figure 1C:
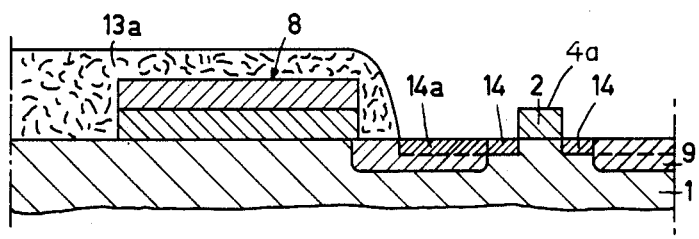

As shown in FIG. 1B, and edge 12 of the bottom layer 2 is removed by lateral etching from the bottom layer from the aperture 5 at the circumference of the first mask portion 4. During this treatment the second mask portion 8 is protected by a coating layer 13 of a suitable nature, for example, of polymerized photolacquer. The second layer 3 of the mask portion 4 is then removed selectively, the coating layer 13 or another coating layer 13a of a similar shape as shown in FIG. 1C being used. Therefore only the remainder 4a of bottom layer 2 of the first mask portion 4 remains. A dopant of the second conductivity type is then provided from the free surface of the semiconductor 1, for example by ion implantation, to form the extrinsic portion 14 of the base region of the transistor at the periphery of remainder 4a of the first mask portion 4. The implanted region extends on the other side up to the boundary of the coating layer 13a through a part of the connection zone 9 of the same type so that the common part 14a ensures a good electric continuity between the connection zone 9 and the extrinsic portion 14 of the base region.

It will be obvious that the boundaries of the coating layer 13a (as well as those of the coating layer 13) do not require a great accuracy.

Figure 1D:
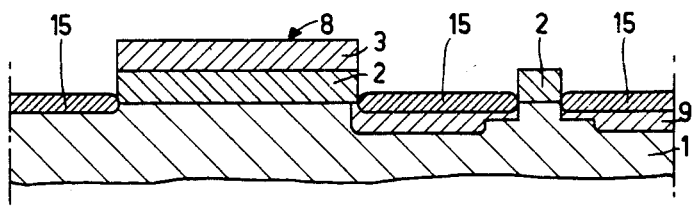

After removing the layer 13a, an insulating mask layer 15 is provided over the whole free surface of the semiconductor 1, for example by oxidation at high temperature, the bottom layer 2 of silicon nitride masking the semiconductor body at the area of the first and second mask portions 4, 8, as shown in FIG. 1D; the insulating mask layer 15 is formed at the areas where the second layer 3 and the bottom layer 2 are both removed. It is to be noted that the bottom layer 2 which in this example is of silicon nitride can be etched selectively with respect to the insulating mask layer of oxide 15, which, as will be explained hereinafter, permits etching the bottom layer 2 several times, while the insulating mask layer 15 is maintained without this requiring a very accurately provided protective layer.

On the other hand, the fact mentioned in the example of obtaining the insulating mask layer 15 by thermal oxidation of the free surface of the semiconductor body presents the advantage that the layer 15 is not formed at the area of the remainder of the second mask portion where the layer 15 is not desired. The same result could be obtained by anodic oxidation of the free surface of the semiconductor body.

However, this does not exclude the use of any other known method which makes it possible, without an accurate photomasking treatment, to remove parts of an insulating masking layer which covers the surface of the mask portions 4, 8, use being made of the possibility of selectively depositing or removing material.

Figure 1E:
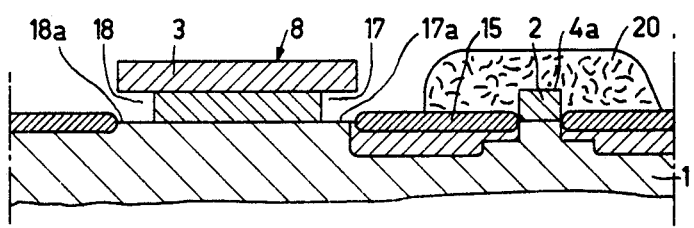

As shown in FIG. 1E, according to the invention the bottom layer 2 of the mask portion 8 is then subjected to a lateral etching treatment in which two edges 17 and 18 of the bottom layer are removed and at the area of said edges two windows 17a and 18a are formed. The window 17a serves for the base contact of the transistor, while the window 18a is destined for the collector contact. These two windows are situated on either side of the second mask portion 8. During the lateral etching of the two edges 17 and 18 of the bottom layer 2 in the second mask portion 8, the remainder 4a of the first mask portion 4 is coated by a coating layer 20, for example, of the same nature as the coating layer 13 (FIG. 1B). The coating layer 20 may well project beyond the circumference of the remainder of the first island so that a very accurate localisation of said coating layer is not required.

The coating layer 20 is then removed, as well as the part of the second layer 3 of the second mask portion 8. This latter etching treatment may be carried out without protecting the insulating mask layer 15, for example, by ensuring that there is an impurity in the second layer 3 that causes its dissolving rate in a solution of hydrofluoric acid to be significantly greater than that of the pure silicon oxide which forms the layer 15. A sufficiently thick part of the insulating layer 15 remains. In an alternative embodiment, the layer 15 could also be made thicker than the second layer 3.

By means of a fresh coating layer 21 (see FIG. 1F), for example, of polymerized photolacquer, the window 17a for the base contact is selected; via this window an impurity of the second conductivity type is introduced in the semiconductor by ion implantation so that a contact zone 22 is formed which adjoins the connection zone 9 of the base region of the transistor.

Figure 1F:
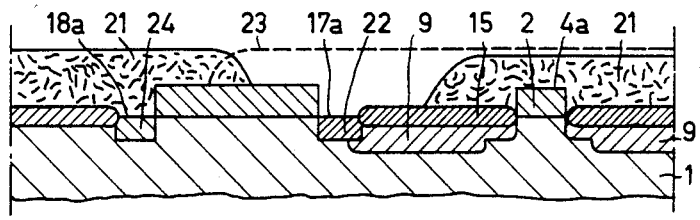

The coating layer 21 is then removed and the window 18a is selected by means of another coating layer 23 (shown in broken lines in FIG. 1F). Via this window an impurity of the first conductivity type is introduced (likewise by ion implantation) so as to obtain the contact zone 24 for the collector of the transistor. It will be obvious that the coating layers 21 and 23 do not require a great positioning accuracy.

Figure 1G:
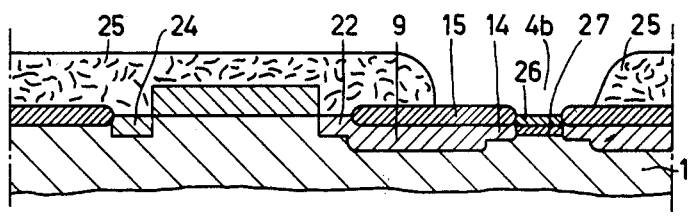

As shown in FIG. 1G, finally the place of the emitter of the transistor is selected by means of a coating layer 25 of polymerized photolacquer and the remainder 4a of the first mask portion is removed selectively so that the window 4b is exposed. The width of this window is reduced with respect to the initial width of the first mask portion of the mask by the lateral etching of the bottom layer, as described above.

Via the window 4b, first an impurity of the first conductivity type and then an impurity of the second conductivity type is introduced into the semiconductor by two successive ion implantations. This latter impurity is implanted deeper than the first and/or has a greater thermal diffusion coefficient thereof than that of the first impurity. In this manner the emitter region 26 and the intrinsic portion of the base region of the transistor are formed.

After removing the coating layer 25, a thermal treatment is carried out to redistribute the implanted impurities, during which treatment these impurities diffuse down to optimum, previously determined, depths.

Figure 1H:
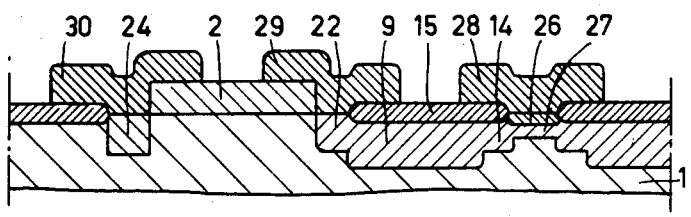

The manufacture of the device is completed by providing the conductors which make contact with the three regions of the transistor: the conductor 28 which is in direct contact with the emitter region 26, the conductor 29 with the base region 27 (via the connection and contact zones 9 and 22), the conductor 30 with the collector region which is formed by the initial material of the plate 1. The completed device is shown in FIG. 1H.

Figure 1I:
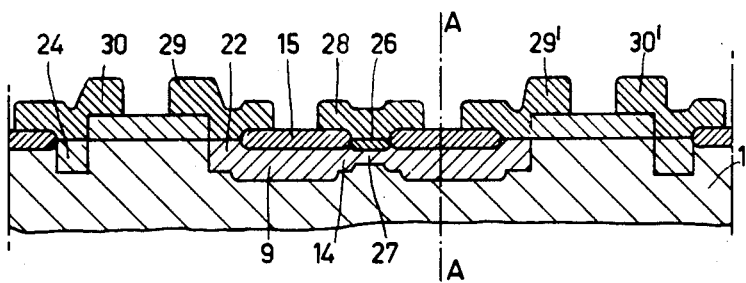
FIG. 1I is a diagrammatic sectional view of another type of transistor which can be manufactured by means of the method of the invention, in the final phase of the manufacture thereof.

FIG. 1I is a cross-sectional view of a transistor manufactured in the same manner, the base and the collector of which extend symmetrically on either side of the emitter region 26. (The portion of FIG. 1I to the left of vertical line A—A is the view shown in FIG. 1H.) So this transistor has two base contacts (29 and 29′) and two collector contacts (30 and 30′). In addition to the advantage of an emitter of very small dimensions, this transistor shows a very weak base resistance $r_{bb}$. The construction thereof with the above-described method is possible by dividing the second mask portion 8 into two identical mask portions situated symmetrically on each side of the central island 4.

The example which will be described hereinafter with reference to the sectional views 2A to 2N and the plan views 3A–3I relates to the manufacture of a bipolar integrated transistor in which the deep insulation region which insulates the transistor from other elements integrated in the same semiconductor crystal is registered in the same time as the regions of said transistor.

Figure 2A:
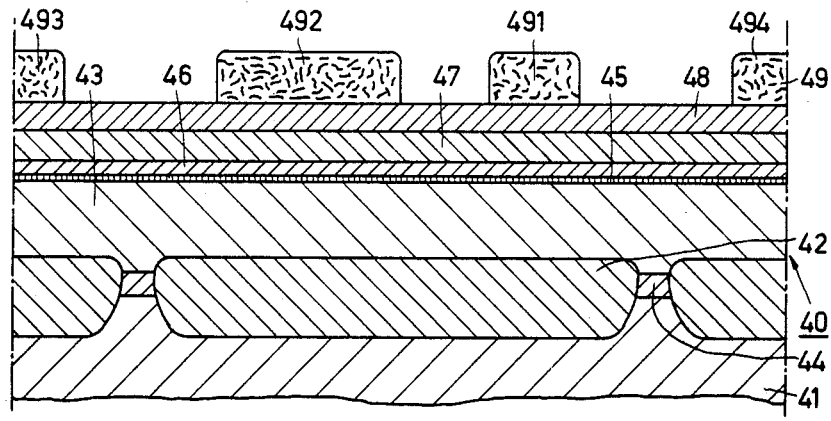
FIGS. 2A to 2N are diagrammatic sectional views of a semiconductor device manufactured by means of a further embodiment of the invention.

FIG. 2A shows a silicon body 40 having a substrate 41 which is of the p-type and is weakly doped. Buried layers, for example the layer 42, are formed in the substrate by deposition of an n-type impurity, for example antimony, and diffusion of said impurity, which layer is situated at the area of the transistor which is to be manufactured. An epitaxial layer 43 of n-type silicon is then provided on the substrate 41 and is doped, for example, with arsenic and has a resistivity on the order of 0.5 to 2.5 ohm.cm.

The strongly doped buried layers such as layer 42 are separated by zones 44 obtained, for example, by boron implantation and destined to prevent the formation of channels which might occur in a later stage at the interface between a semiconductor material and an insulating zone, which channels could produce a short-circuit between the regions which should remain insulated from each other. The layer 42 is to form a collector current path which conducts the current to the collector contact of the bipolar transistor.

A thin layer 45 of silicon oxide having a thickness on the order of 0.02 μm is formed on the upper surface of the epitaxial layer 43 and is to protect the surface of the silicon. A silicon nitride auxiliary layer 46 is then provided. The layers 45 and 46 can be formed in a generally known manner (for example thermal oxidation at 900° C. for the oxide and plasma deposition for the nitride).

A first layer 47 of aluminium oxide is formed on the layer 46 by cathode sputtering or by anodic oxidation of a layer of aluminium.

Finally a second layer 48 of silicon nitride is formed. The layer 48 is obtained in a plasma reactor, for example at a temperature in the order of 300° C. instead of in the usual manner at high temperature (750° to 900° C.) in which the aluminium oxide of the bottom layer 47 could convert to an allotropic variety ($Al_2O_3\alpha$) which is very difficult to etch.

The thickness of the last three layers is between 0.05 and 0.08 μm for the auxiliary layer 46, between 0.10 and 0.20 μm for the bottom layer 47, and between 0.10 and 0.16 μm for the second layer 48.

By means of a photosensitive lacquer, a coating layer 49 is provided on the layer 48 according to the configuration of the principal mask. The coating layer 49 comprises inter alia a part 491 which is situated above the site of the emitter and a part of the base of the transistor to be manufactured, a part 492, which is situated above the side which extends from the base contact to the collector contact of the transistor and two lateral parts 493 and 494 which are shown only partly in FIG. 2A and which are situated at the periphery of the deep insulation region to be formed which is to surround the transistor.

The part 491 may be, for example, rectangular and be 8 μm×4 μm; the part 492 which by way of example is a square, is 8 μm×4 μm. The edges of the part 491 and 492 are 4 μm apart; the parts 493 and 494 are, for example, 7 μm remote from the parts 492 and 491, respectively.

Figure 2B:
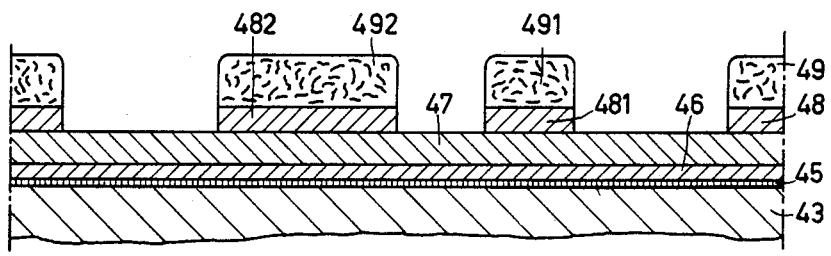

As shown in FIG. 2B, the second layer 48 is etched via the apertures in the coating layer 49. A plasma based on carbon tetrafluoride and oxygen is preferably used for said etching treatment. In this manner, high temperatures can be avoided and the underlying bottom layer of aluminium oxide 47 is hardly influenced detrimentally. Parts 481 and 482 are formed in the second layer 48 and mark boundaries of the deep insulation region to be formed on the left of part 482 and on the right of part 481 in FIG. 2B.

Figure 2C:
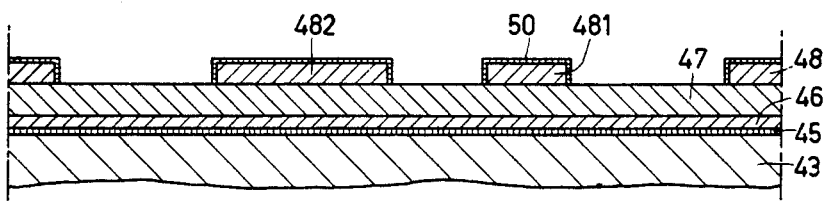

The coating layer 49 is then removed and the nitride surfaces 481 and 482 are oxidized (see FIG. 2C). This oxidation is carried out at a comparatively low temperature (<700° C.) in such manner that a conversion of the aluminium oxide of the bottom layer 47 to a chemically stable allotropic bottom layer is avoided: this oxidation is carried out in an atmosphere of oxygen and hydrogen at a pressure in the order of 25 bar, the temperature being between 630° C. and 690° C. The thin oxynitride layer 50 thus formed has a thickness on the order of 0.01 μm.

Figure 2D:
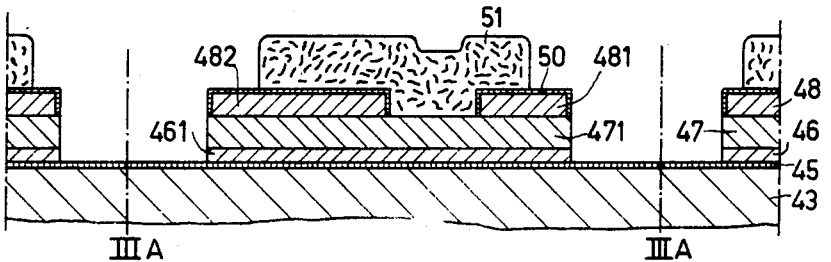
Figure 3I:
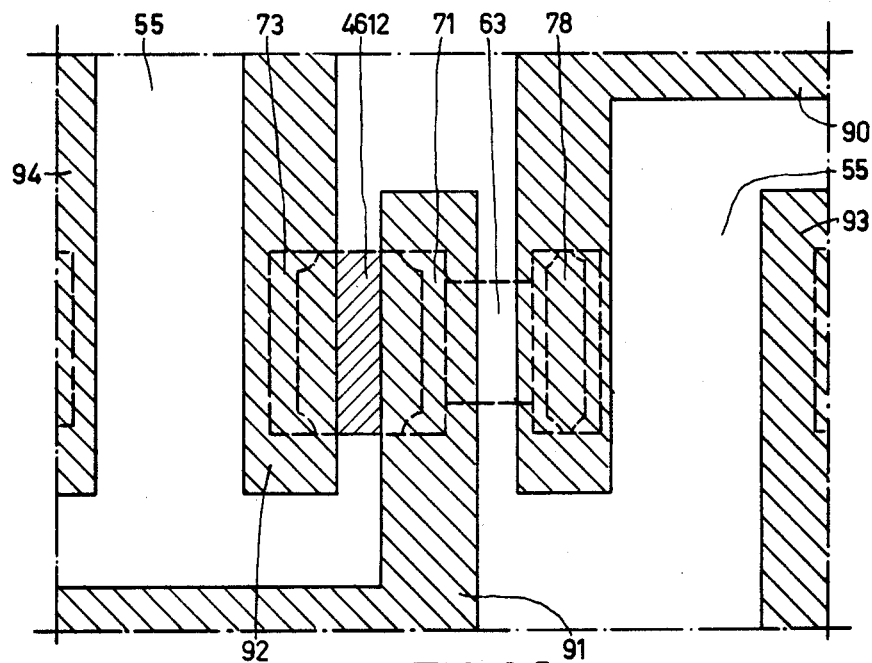
FIGS. 3A to 3I are plan views which correspond to sectional views of FIGS. 2A to 2N, FIGS. 4A to 4D show a modified embodiment of the method described with reference to FIGS. 2.
Figure 3A:
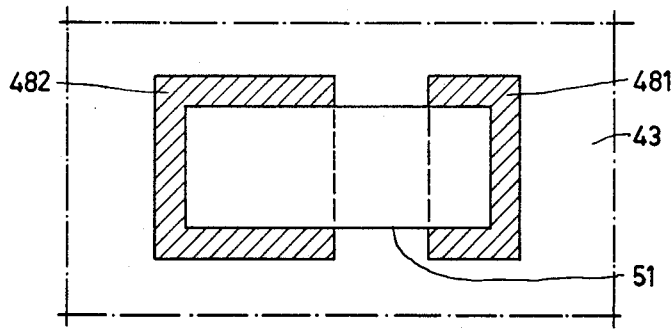

As shown in FIG. 2D (and in the plan view of FIG. 3A which corresponds with the part situated between the vertical lines IIIA of FIG. 2D) a coating layer 51 of polymerized photolacquer is then formed on the wafer. Said cover layer partly protects the recess which is present between parts 481 and 482 and leaves freely accessible the parts of the bottom layer 47 which are situated in the other recesses of the layer 48 which correspond to the location of the insulation region to be formed.

The bottom layer 47 of aluminium oxide is then etched by means of a solution of ammonium fluoride in acetic acid. Etching is discontinued at the layer 46 of silicon nitride and part 471 of the bottom layer remains. The layer 46 is then etched, for example by means of a fluoride plasma, as carried out above for the layer 48. Etching is discontinued by the thin layer 45 of silicon oxide which protects the silicon body; the layer 50 masks the parts 481 and 482 of the second layer during said etching step. The part 461 of the auxiliary layer remains.

Figure 2E:
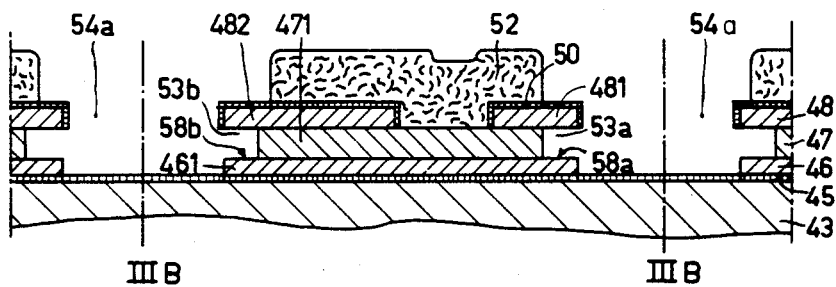

As shown in FIG. 2E and in the plan view 3B (which corresponds to the part of FIG. 2E situated between the vertical lines IIIB) a fresh cover layer 52 of polymerized photolacquer is formed. Said cover layer protects the recess which is present between the parts 481 and 482 and covers most of their sides 481a and 481b, 482a 482b which are parallel to the plane of FIG. 2E (see FIG. 3B), as well as the corresponding sides of the parts 471 and 461. The part 471 of aluminium oxide is then etched laterally. Said etching is carried out by means of a solution of phosphoric acid at a temperature of 60° C. At this temperature the silicon nitride is not attacked; moreover, the oxide layer 45 protects the underlying silicon. Etching causes undercutting which in FIG. 2E corresponds to the edges 53a (on the right of part 471) and 53b (on the left of part 471) of the bottom layer 53 having a depth of approximately 2 μm. This etching exposes the auxiliary layer edges 58a and 58b on the right and left sides of the part 461.

Figure 3B:
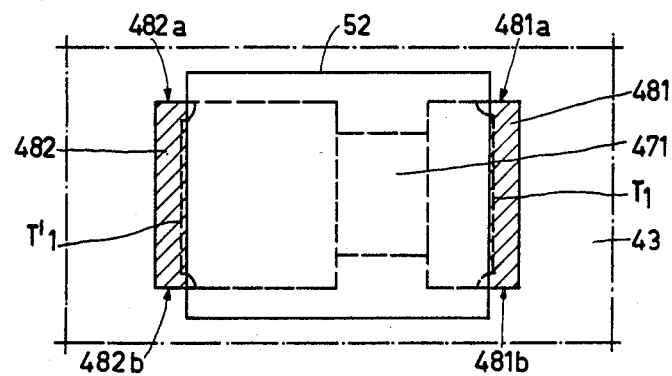

The broken lines $T_1$ and $T'_1$ in the plan view of FIG. 3B in this stage denote the lateral boundary of the aluminium oxide surface 471. To be noted are the slightly deeper recesses produced in known manner by chemical etching at the corners of the said surface 471.

The coating layer 52 is then removed and, by dipping the body in a bath of hydrofluoric acid, the oxynitride layer 50 is selectively removed, as well as the exposed parts of the oxide layer 45. A first aperture 54a of the mask is then obtained.

By etching via the first aperture 54a, silicon is removed from the semiconductor body by means of a solution of hydrofluoric acid, nitric acid, acetic acid and iodine; this solution does not or substantially not attack the silicon nitride and the aluminium oxide. The etching treatment is continued until a groove has been obtained which has a depth between half and two thirds of the thickness which the deep insulation region is to have through the epitaxial layer 43 into the substrate 41. The grooves are then filled with silicon oxide by thermal oxidation. This is carried out by oxidation under pressure at a temperature lower than 700° C. so as to avoid conversion of the aluminium oxide, as described above. The oxidation is carried out in an atmosphere of saturated water vapour at a pressure of 90 atmospheres, at a temperature of 650° C.; the oxidation lasts from two to ten hours dependent on the thickness of the layer 43. The deep insulation region thus formed is referenced 55 in FIG. 2F; laterally at the surface the oxide shows "bird beak" profiles of approximately 1 μm which are shown in the drawing.

The region 55 insulates, in the layer 43, a region 43a in which the transistor can now be realised.

Figure 2F:
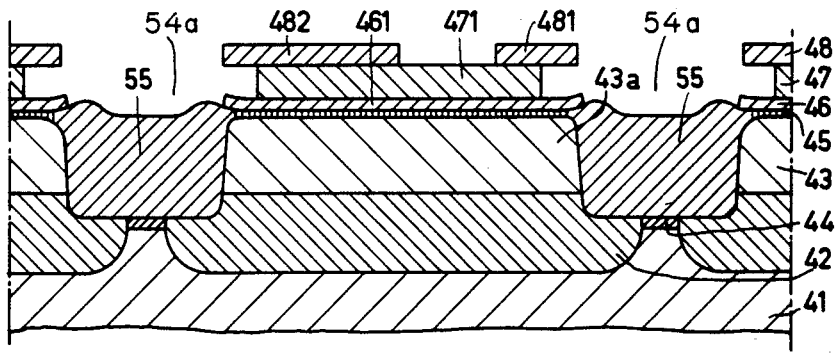
Figure 2G:
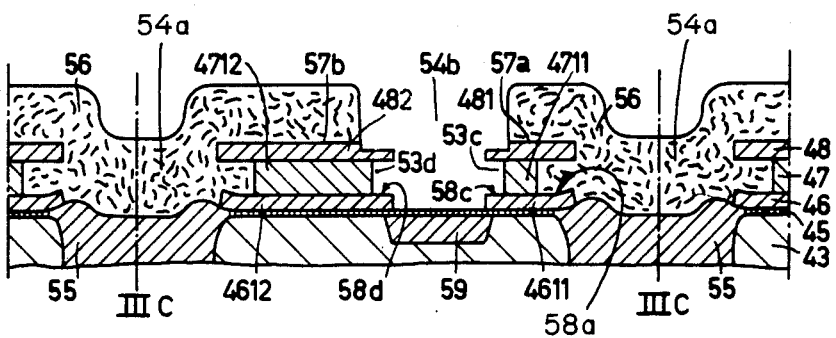

As shown in FIG. 2G and the plan view 3C (which corresponds to the part situated between the lines IIIC of FIG. 2G) a fresh coating layer 56 of polymerised photolacquer is provided on the wafer and fills the aperture 54a but does not cover the opening between the nitride parts 481 and 482. Through this opening the aluminium oxide surface 471 is etched by means of a phosphoric acid solution at 60° C. so that it is divided into two parts 4711 and 4712. The underlying part 461 of silicon nitride is then also etched with plasma on the basis of fluoride and oxygen, so that this is divided into two parts 4611 and 4612. During said etching the exposed edges of the parts 481 and 482 also are etched slightly; because, however, the layer 48 initially is provided to be thicker than the layer 46, a sufficient thickness of material finally remains at the edges of the parts 481 and 482.

Except through thin oxide layer 45, a second opening 54b is formed in the mask to create two mask parts on either side of said second opening 54b; a first mask part 57a which covers the emitter region of the transistor and which, from the top to the bottom in the figure, comprises the part 481 (second layer) and the part 4711 (bottom layer) and then an auxiliary part 4611; a second mask part 57b which in particular covers the collector region of the transistor which is formed by a part of the region 43a and which comprises the part 482 (second layer) and the part 4712 (bottom layer) and an auxiliary part 4612.

Starting from the opening 54b of the mask, the parts 4711 and 4712 are then etched laterally. In this manner a bottom layer edge 53c of the part 4711 of the first mask part 57a is removed so that a strip 58c of the auxiliary layer is exposed on the part 4611; a bottom layer edge 53d of the part 4712 of the second mask part 57b is also removed so that a strip 58d of the auxiliary layer on the surface 4612 is exposed. This lateral etching which is carried out in a phosphoric acid solution at 60° C. is continued down to a depth of 1 μm.

Figure 3C:
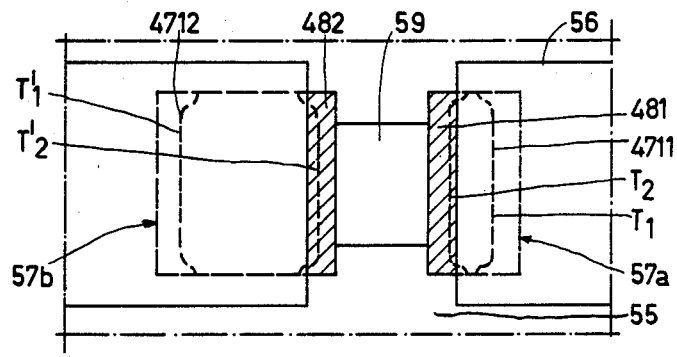
Figure 3D:
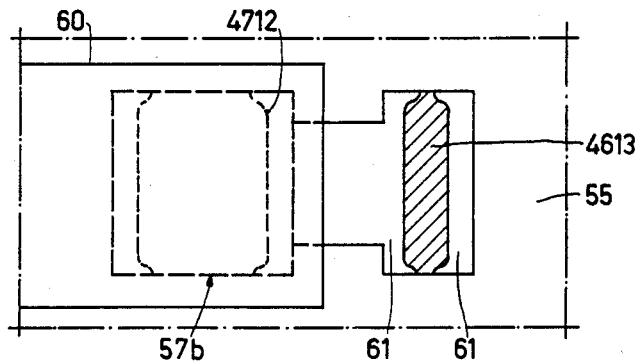
Figure 3E:
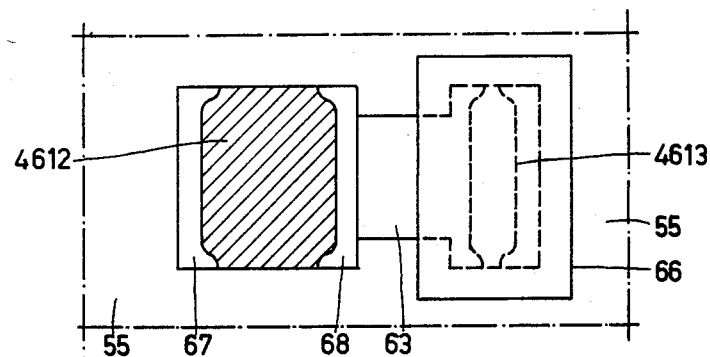
Figure 3F:
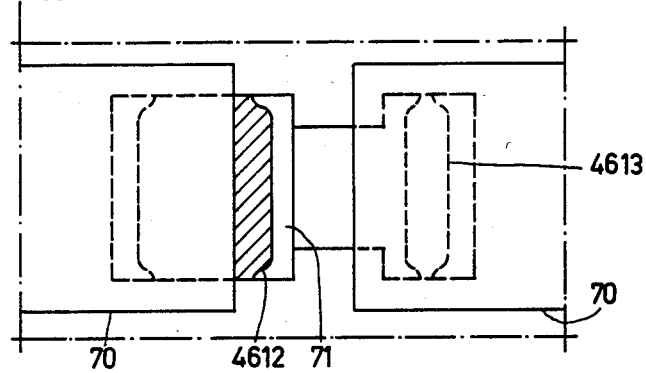
Figure 3G:
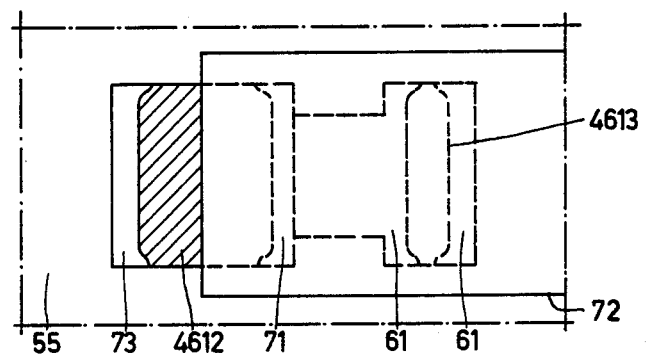
Figure 3H:
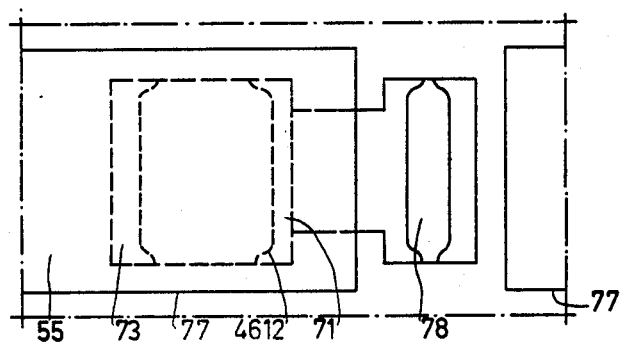

The broken lines $T_2$ and $T_1$, $T'_2$ and $T'_1$ in the plan view of FIG. 3C mark the boundaries in this stage of the parts 4711 and 4712, respectively. Etching is slightly stronger at the corners of the said parts, which is shown by the curves of the ends of the said lines.

The connection zone 59 of the base region of the transistor is formed in the semiconductor body by implantation of boron ions via the aperture 54b of the mask and via the thin oxide layer 45. The conditions (energy and dose) are chosen to be so that said connection zone has a sheet resistance of at most 50 Ohm per square.

Figure 2H:
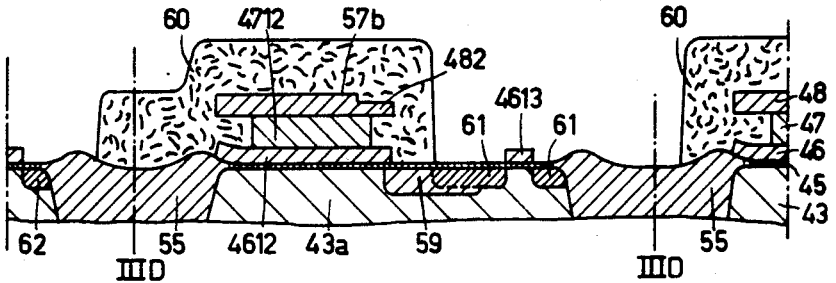

As shown in FIG. 2H and the plan view 3D (which corresponds to the part of FIG. 2H situated between the vertical lines IIID) a fresh coating layer 60 is provided, for example, of a polymerised photolacquer which protects the second mask part 57b and leaves the first mask part 57a accessible.

The part 481 of the second layer 48 and the strips 58a and 58c of part 4611 of auxiliary layer 46 are then removed by etching with plasma of fluoride and oxygen.

The bottom layer 4711 of the first mask part 57a is also removed by means of a solution of phosphoric acid at 60° C. The part 4613 of auxiliary layer which forms the remainder of the first mask part is maintained and serves as a mask during the next implantation phase of boron ions during which the extrinsic portion 61 of the base region of the transistor is provided. The implantation circumstances are chosen to be so that the sheet resistance in said part 61 is near 400 Ohm per square.

The parts 61 of the base on either side of the layer 4613 have a width of approximately 1 μm.

FIG. 2H furthermore shows a zone 62 which, for example, forms part of the extrinsic base of an adjacent transistor and which can be realized simultaneously with the part 61.

Figure 2I:
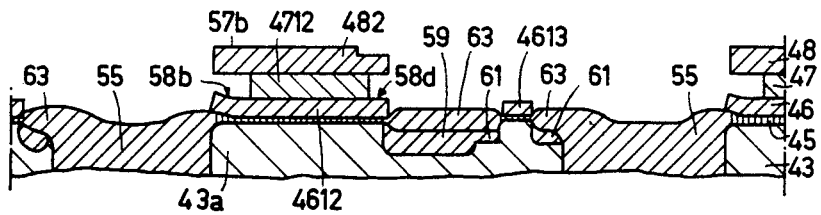

As shown in FIG. 2I the coating layer 60 is then removed. The exposed part of the thin oxide layer 45 is also removed, for example, by a rapid dipping in a solution of hydrofluoric acid to which ammonium fluoride has been added. The layer 45 is comparatively thin so that during the removal thereof the properties of the insulation region 55 do substantially not vary. An insulating layer 63 having a thickness between 0.1 and 0.3 μm is formed on the exposed surface of the silicon body by oxidation under pressure at 650° C., as already stated in connection with the insulation region 55, and in which conversion of the aluminium oxide of the second mask part 57b is avoided.

Figure 2J:
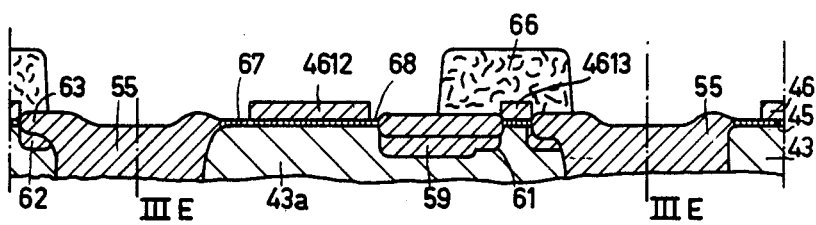

As shown in FIG. 2J and the plan view 3E (which corresponds to the part of the FIG. 2J situated between the vertical lines IIIE), a fresh covering layer 66 of polymerised photolacquer is provided which covers the part of silicon nitride 4613 and which does not cover the second mask part 57b. The silicon nitride part 482 is then removed, as well as the strips 58b and 58d of the part 4612 of the auxiliary layer 46, by etching with plasma based on fluoride and oxygen. The bottom layer 4712 of the second mask part 57b is also removed by means of a solution of phosphoric acid at 60° C.

Two windows 67 and 68 are then obtained at the surface of the region 43a of the epitaxial layer (it is not necessary to remove in these windows the thin oxide layer 45). Said windows have a width of approximately 1 μm, the undercutting depth and, for window 67, the "bird beak" profile of the insulation region 55 being also taken into account.

Figure 2K:
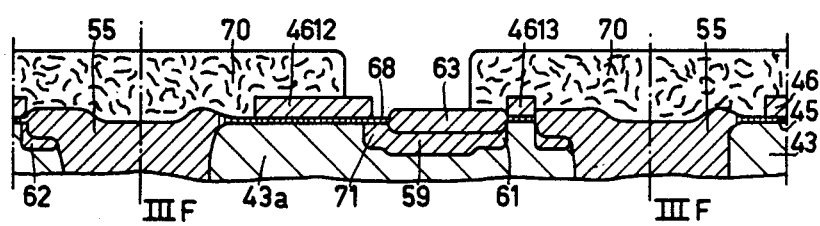

The cover layer 66 is removed and, as shown in FIG. 2K and the plan view 3F (which corresponds to the part present between the vertical lines IIIF of FIG. 2K), a fresh cover layer 70 of polymerised photolacquer is formed which protects the whole surface with the exception of the window 68. Via this window the base contact zone 71 is formed by implantation of boron ions. It is connected to the extrinsic part 61 by the connection zone 59.

Figure 2L:
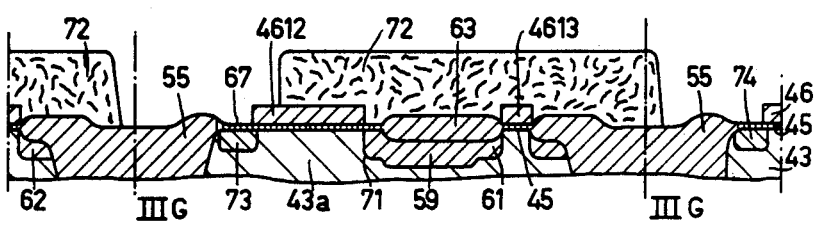

The cover layer 70 is then removed and, as shown in FIG. 2L and the plan view 3G (which corresponds to the part of FIG. 2L present between the vertical lines IIIG), the collector contact zone 73 is provided by implantation of arsenic ions by means of another cover layer of polymerised photolacquer 72 which does not cover the window 67. FIG. 2L furthermore shows a collector contact zone 74 for an adjacent transistor which can be realised simultaneously with the contact zone 73.

Figure 2M:
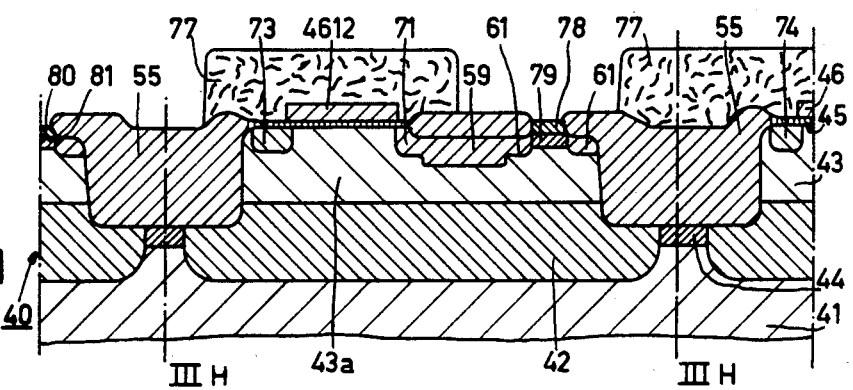

The cover layer 72 is then removed again and, as shown in FIG. 2M and the plan view 3H (which corresponds to the part of FIG. 2M situated between the vertical lines IIIH), a fresh cover layer 77 of polymerised photolacquer is formed which does not cover the part 4613 (remainder of the first mask part) of the auxiliary layer 46 of silicon nitride. The part 4613, as well as the underlying part of the thin oxide layer 45, is removed in the usual manner. A window has then been obtained via which the emitter region 78 and the intrinsic portion 79 of the base region of the transistor are provided by arsenic implantation and implantation of boron ions, respectively, in the silicon. The latter implantation occurs with such a dose that a sheet resistance of 800 Ohm per square is obtained. The widths of the part 4711 of the bottom layer and of the part 4613 of the auxiliary layer and the depth of the undercutting can be chosen to be so that an emitter region having a width of approximately 1 μm is obtained.

FIG. 2M furthermore shows an emitter region 80 and an intrinsic base region 81 of an adjacent transistor which have been implanted simultaneously with the regions 78 and 79.

The cover layer 77 is then removed after which a thermal treatment is carried out to redistribute the implanted impurities. This annealing is carried out in neutral atmosphere of, for example nitrogen at a temperature between 900° C. and 1050° C. for approximately 30 minutes. As a result of this annealing the various regions of the device reach their depths and their optimum final doping concentrations.

Figure 2N:
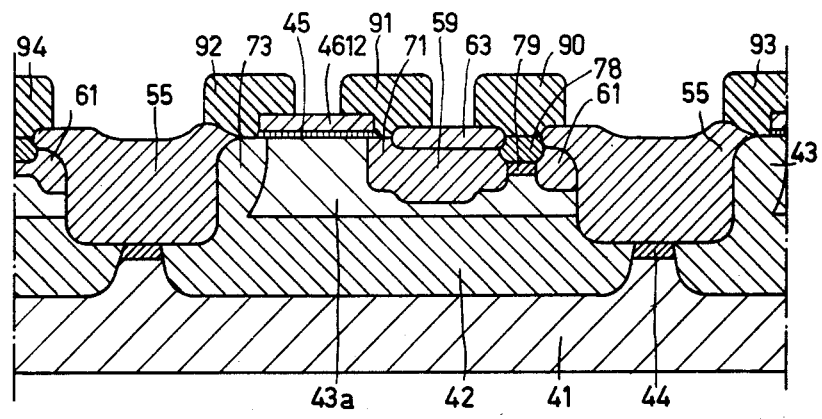

The manufacture of the transistor is completed by forming conductors usually consisting of aluminium. For the manufacture of said conductors any known method may be used. FIG. 2N shows the conductor 90 which contacts the emitter region 78, the conductor 91 which contacts the base region (more accurately the base contact zone) and the conductor 92 which contacts the collector region 43a. In the above-described case said conductors may have a width of 4 μm and a mutual separation distance of 2 μm.

The completed transistor is shown in the sectional view of FIG. 2N and the plan view 3I. These figures moreover show a conductor 93 which contacts the collector region of an adjacent transistor and a conductor 94 which contacts the emitter region of another adjacent transistor.

A variation of the above-described embodiment will now be described with reference to FIGS. 4A to 4D.

The modification is related to the replacement of aluminium oxide by silicon oxide as a material for the bottom layer 47 and the replacement of silicon oxide by aluminium oxide to form the deep insulation region 55.

In the above case it was necessary to take some precautions with respect to the temperatures used—especially the temperature for the formation of silicon nitride—so as to avoid the aluminium oxide of the bottom layer 47 from becoming resistant to etching.

In the present embodiment this difficulty is avoided.

FIG. 4 illustrates only those stages of the manufacture which differ considerably with respect to the method described in FIG. 2. For parts corresponding to those of FIG. 2 the same reference numerals have been used.

As a starting point is taken the stage in which only the second layer is patterned by etching. This stage (corresponding to FIG. 2B) is shown in FIG. 4A.

Figure 4A:
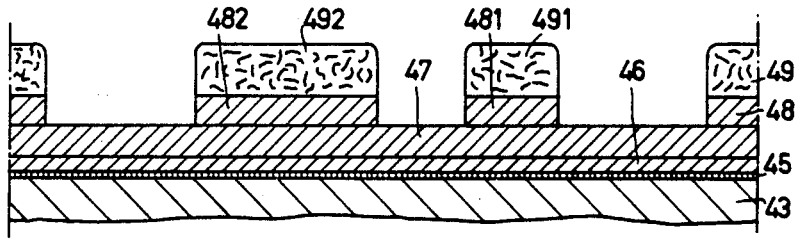

FIG. 4A shows in particular the epitaxial layer 43, the thin layer 45 of silicon oxide, the auxiliary layer 46 of silicon nitride, the bottom layer 47 which in this case is of silicon oxide (and which, for example, is doped with phosphorus so as to increase the etching rate with respect to that of the pure oxide), and the second layer 48 of silicon nitride. Parts 481 and 482 have been formed in said second layer 48 via the apertures of a cover layer 49 having the configuration of the main mask.

The silicon nitride and the oxide can be deposited in the usual manner without any restriction as regards the growth temperature. The thicknesses of the depositions 45, 46, 47 and 48 are substantially the same as in the above-described embodiment.

Figure 4B:
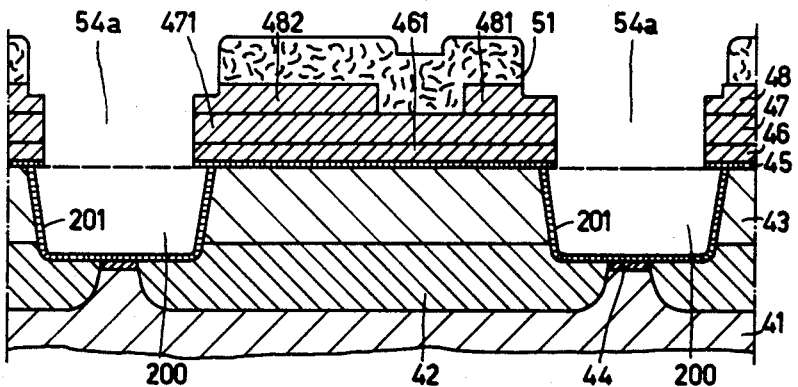

As shown in FIG. 4B, there have been etched successively—the cover layer 51—the bottom layer 47 of oxide (in the usual manner by means of a solution of ammonium fluoride and hydrofluoric acid), then the auxiliary layer 46 of nitride by means of a plasma of carbontetrafluoride and oxygen or by any other suitable method, possibly even those which necessitate a high temperature (since the bottom layer 47 has now been formed of silicon oxide and not of aluminium oxide). It is to be noted that a layer of oxynitride, as the layer 50 of FIG. 2, has been provided on the parts 481 and 482; consequently, these parts are slightly attacked during the etching of the auxiliary layer 46 which, as these parts, is made of silicon nitride.

In this stage of the manufacture the cover layer 51 is removed. The exposed parts of the oxide layer 45 are then removed by dipping the wafer in a bath of hydrofluoric acid. Said etching involves a slight unimportant excavation of the bottom layer 471 which, compared with the said layer 45, is much thicker than layer 45.

The first opening 54a has now been obtained via which the silicon of the semiconductor body is etched by means of a solution of hydrofluoric acid, nitric acid, acetic acid and iodine; this solution which is neutral with respect to the silicon nitride only slightly attacks the silicon oxide. As a result of this a groove 200 is obtained transversely across the layer 43 down to the underlying substrate 41 (depth of the cavity≈1.3 μm assuming that layer 42 is 1 μm. A layer 201 of silicon oxide is provided on the walls of the groove in dry oxygen at 1000° C.

Figure 4C:
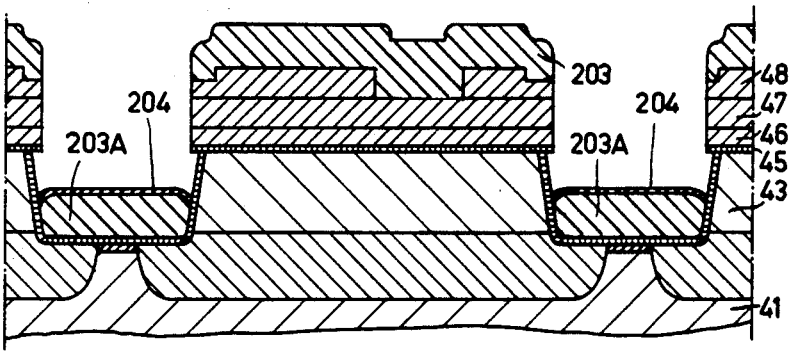

As shown having FIG. 4C a layer 203 of aluminium is then deposited on the surface in a thickness of 0.7 l to 0.8 μm (with an epitaxial layer the thickness of which is approximately 1 μm). This layer is not continuous; the aluminium 203A deposited in the groove 200 is separated from the remainder of the layer.

Only on this aluminium 203A is formed a thin layer 204 of dense aluminium oxide having a thickness of approximately 0.1 μm. Layer 204 is obtained in known manner by anodic oxidation, the body 40 being dipped in a bath of a solution of tartaric acid or ammonium tartrate at a temperature of approximately 25° C.; the Al-layer 203A is connected to the positive terminal of a direct voltage generator, another electrode, for example, made of aluminium and dipped in the bath, being connected to the negative terminal of the generator; a potential difference of 40 to 120 V is applied between the two electrodes for a time interval which is between 1 and 5 minutes dependent on the voltage used. Because the aluminium oxide formed in these circumstances is dense, the anodisation is discontinued automatically.

The non-anodized aluminium is then removed selectively, for example, by etching in a solution of iron chloride. During this treatment the dense layer 204 protects the underlying aluminium 203A. The layer 204 is then removed by dipping the wafer in a solution of pure anhydrous acetic acid to which ammonium fluoride (10 to 40 g per liter) has been added. This solution is neutral with respect to the silicon nitride and the silicon and attacks the silicon oxide only very slightly.

The exposed aluminium 203A is then oxidized completely. This time the Al is converted into porous aluminium oxide so that the whole remaining layer 203A is converted into Al$_2$O$_3$. The Al may be converted by anodic oxidation in a bath based on sulphuric acid or, preferably, oxalic acid (80 g per liter of water) at a supply voltage of 12 to 15 volts. The aluminium 203A which is 0.7 to 0.8 μm thick is converted in approximately 3 minutes into porous aluminium oxide, the current being near 60 mA.

Figure 4D:
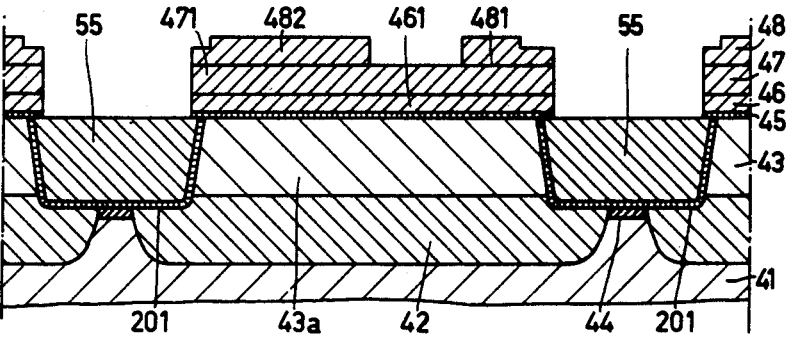

This conversion of Al into Al$_2$O$_3$ is accompanied by an increase in volume so that after the treatment the aluminium oxide occupies the overall volume of the groove 200. The insulation region 55 has been formed in this manner. In the present case the surface of said region is flatter than in the preceding embodiment; in particular the "bird beak" does not appear. This stage of the manufacture is shown in FIG. 4D.

The part 471 may then be subjected to a lateral etching treatment in a usual solution of hydrofluoric acid to which ammonium fluoride has been added so that the stage shown in FIG. 2F is reached.

The manufacture of the transistor may then be completed in the manner which is described with reference to FIGS. 2G to 2N. Of course it is necessary to replace the solution used initially for etching a bottom layer 47 of aluminium oxide by the solution of hydrofluoric acid to which ammonium fluoride has been added which is necessary since said bottom layer is now silicon oxide. However, attention is drawn to two detail points:

During the lateral etching treatment of the parts 4711 and 4712 of oxide, which leads to the exposure of the layers 58c and 58d in the parts 4611 and 4612 of the auxiliary layer 46 (see FIG. 2G), the part of the oxide layer 45 situated on the bottom of the aperture 54b of the mask is also removed. This oxide layer must be restored again so as to protect the underlying silicon when afterwards the part 481 and the strips 58a and 58c of part 4611, all of nitride, are removed. For restoring the layer 45 it will suffice to dip the wafer 40 in fuming nitric acid or sulphuric acid to which hydrogen perioxide has been added for 10 to 15 minutes, after which the manufacturing process can be resumed as described from FIG. 2H on.

During the removal of the oxide layer 4712 (see FIG. 2J) it cannot be avoided that the insulating masking layer 63 which itself is of oxide is attacked. However, this attack of the layer 63 is very superficial because the doped oxide of the part 4712 is etched much more rapidly than the said layer 63. The oxide 45 is also removed in the windows 67 and 68, but this does not cause any difficulty for the remainder of the manufacturing process.

Of course, the method according to the invention does not prevent the manufacture of circuit elements for integrated circuits other than bi-polar transistors. For example, resistors may be provided simultaneously in the same body. Field effect transistors of small dimensions can also be manufactured in which in particular the distance between the source and the drain could be very short.

What is claimed is:

1. A semiconductor device in which an electrically insulating layer with a window therethrough lies along an upper surface of a first region of a semiconductor body wherein a second region of a first conductivity type extends to the upper surface within the window, a first zone of a second conductivity type opposite to the first conductivity type upwardly adjoins the insulating layer, a second zone of the second conductivity type upwardly adjoins the second region below the window, a third zone of the second conductivity type located apart from the second zone extends to the upper surface to serve as a contact zone, the zones and the insulating layer upwardly and laterally enclose the second region, and the first region excluding the zones and any oxidized portion thereof is of the first conductivity type, characterized in that a first segment of the first zone is continuous with the third zone and adjoins at least part of the lateral edge of the insulating layer located apart from the window and that a second segment of the first zone continuous with the first segment is continuous with the second zone, adjoins at least part of the lateral edge of the insulating layer located along the window, and has a sheet resistance much greater than that of the first segment.

2. A device as in claim 1 characterized in that the third zone is adjacent to but substantially not below the insulating layer.

3. A device as in claim 2 characterized in that the insulating layer has a thickness in the range of 0.1 micron to 0.3 micron and that the first zone upwardly adjoins substantially all of the lower surface of the insulating layer.

4. A device as in claim 1 characterized in that the third zone does not connect to the second zone by way of material of the second conductivity type outside the first zone.

5. A device as in claim 1 characterized in that the device comprises a bipolar transistor having: an emitter comprising the second region, a base comprising the zones, and a collector comprising the first region excluding the zones and any oxidized portion thereof.

6. A device as in claim 5 characterized in that the first region has a more heavily doped portion along the upper surface spaced apart from the zones.

7. A device as in claim 6 characterized by a deep insulation region extending laterally around the periphery of the transistor, the insulation region and the body respectively consisting substantially of aluminum oxide and silicon.

* * * * *